United States Patent [19]

Horiuchi et al.

[11] 4,295,265
[45] Oct. 20, 1981

[54] METHOD FOR PRODUCING A NONVOLATILE SEMICONDUCTOR MEMORY

[75] Inventors: Masatada Horiuchi, Koganei; Hisao Katto, Tokyo, both of Japan

[73] Assignee: Hitachi, Ltd., Tokyo, Japan

[21] Appl. No.: 58,501

[22] Filed: Jul. 18, 1979

[30] Foreign Application Priority Data

Jul. 31, 1978 [JP] Japan .................. 53-92634

[51] Int. Cl.³ .............................. H01L 21/28
[52] U.S. Cl. ........................ 29/571; 148/187; 357/23
[58] Field of Search ............. 29/571; 357/23; 148/187

[56] References Cited

U.S. PATENT DOCUMENTS

| 3,789,504 | 2/1974 | Jaddam | 29/571 |
| 4,090,289 | 5/1978 | Dennard et al. | 29/571 |
| 4,096,522 | 6/1978 | Suzuki et al. | 357/23 X |
| 4,114,255 | 9/1978 | Salsbury et al. | 29/571 |
| 4,235,010 | 11/1980 | Kawagoe | 29/571 |

OTHER PUBLICATIONS

Krick, "The Implanted Stepped-Oxide MNOSFET", *IEEE Transactions on Electron Devices*, vol. ED-22, No. 2, pp. 62-63, Feb. 1975.

*Primary Examiner*—G. Ozaki
*Attorney, Agent, or Firm*—Craig and Antonelli

[57] ABSTRACT

In a nonvolatile semiconductor memory which comprises a source region and a drain region formed on one surface of a semiconductor substrate having one conductivity type, a first insulating film formed on a channel region which is located between the source region and the drain region, a floating gate formed on at least a portion of the first insulating film and which is electrically floated, a control gate formed on the floating gate via a second insulating film, and high impurity concentration regions formed in or near a portion of the channel region and having the same conductivity type as that of the substrate, the floating gate is formed prior to the high impurity concentration regions, and the high impurity concentration regions are formed just outside the channel region by self-alignment with said floating gate using said floating gate as part of a mask.

11 Claims, 10 Drawing Figures

METHOD FOR PRODUCING A NONVOLATILE SEMICONDUCTOR MEMORY

BACKGROUND OF THE INVENTION

1. Field of the Invention

The present invention relates to an electrically writable-erasable nonvolatile semiconductor memory element.

2. Description of the Prior Art

A floating gate avalanche injection-type MOS (hereinafter referred to as FAMOS) has been placed in practical use as an electrically programmable MOS-type nonvolatile memory. Among the FAMOS's, the two-layer gate-type nonvolatile memory which is usually used as an N-channel element, comprises a source region and a drain region formed on one surface of a semiconductor substrate having one conductivity type, the source and drain regions having a conductivity type opposite to that of the semiconductor substrate, a first insulating film formed on a channel region which is located between the source region and the drain region, a floating gate which is formed on at least a portion of the first insulating film and which is electrically floated, a control gate formed on the floating gate via a second insulating film, and a high impurity concentration region formed on a portion of the channel region and having the same conductivity type as that of the substrate. With the above device, the source region and the substrate are maintained at ground potential, and a positive voltage is applied to the drain region and to the control gate. Most of the drain voltage is consumed in a depletion region in the vicinity of the drain region, where a high electric field is maintained, whereby hot electrons and hot holes are generated due to the avalanche in the high impurity concentration region formed in a portion of the channel region. The hot electrons are injected into the floating gate beyond the energy barrier of the first insulating film composed of a gate oxide film. With the above device, however, it is necessary to maintain a margin of mask alignment to form the high impurity concentration region on a portion of the channel region. This makes it difficult to make the elements small in size and, further, the high impurity concentration region reduces the channel width so that the read-out speed is decreased.

In order to preclude the above-mentioned defects, Japanese Patent Application No. 8655/77 proposes a method by which the high impurity concentration region is formed on a portion of a region which is in contact with at least one of the two sides that are in contact with neither the source region nor the drain region in the outer periphery of the channel region. The devices produced by the above method permit easier reading than the earlier similar devices. According to the above-proposed method, however, the device is formed in the order of a high impurity concentration region, a thick oxide film of the field region, gate oxide film, floating gate, source region and drain region. Accordingly, impurities in the high impurity concentration region tend to be diffused by the subsequent thermal steps such as formation of thick oxide films and n+ diffusion, which will be performed at high temperatures for extended periods of time. With the above proposed method, therefore, it is difficult to control the concentrations of impurities and it is also not possible to sufficiently increase the concentrations. Further, since the high impurity concentration region is formed beneath the floating gate, the channel width tends to narrow and the threshold voltage tends to increase. Moreover, the thickness of the gate oxide film should desirably be small to attain high-speed operation. With the above method, however, the impurities are diffused from the floating gate during such a thermal step as n+ diffusion, causing the insulating properties of the thin oxide films to be degraded. Moreover, according to the device disclosed in Japanese Patent Application No. 8655/77, the floating gate has portions riding on the thick field oxide film on both sides of the channel. This causes the floating gate to be stretched in a direction at right angles to a direction in which the source region and the drain region are connected. To cover the floating gate riding on the field oxide film by means of a control gate via the insulation layer is desirable from the viewpoint of increasing the operation speed of the element. From the viewpoint of the layout, however, the control gate is better wired in a direction connecting the source and the drain. According to the above-mentioned setup, therefore, the width of the control gate tends to increase, causing the necessary areas to increase.

With the above-mentioned FAMOS, the writing can be electrically effected, but the memory must be erased by means of ultraviolet light. In an attempt to make a memory device which electrically effects the writing as well as the erasing and which also precludes the defects of the FAMOS's, there has been proposed a method of implanting ions to a high concentration into the channel after the source region, drain region and a thin oxide film of gate have been formed, followed by the formation of a floating gate. According to this method, it is easy to control the impurity concentration since there is no thermal step that is performed at high temperatures for extended periods of time after the channel has been doped with impurity. However, there still remains a problem resulting from the addition of high concentration impurities in the channel region. Therefore, there is imposed a limit for increasing the concentrations, and further, the implanted ions tend to diffuse in considerable amounts into the gate insulating film to deteriorate the dielectric strength.

SUMMARY OF THE INVENTION

The object of the present invention, therefore, is to provide a method of producing a nonvolatile semiconductor memory which is mentioned earlier having a small area or, in other words, in which the high impurity concentration region is in contact with the channel region and is substantially located outside the channel region, the impurity concentration being allowed to be accurately controlled, and in which the floating gate is extending in a direction to connect the source to the drain.

To achieve the above-mentioned object, the method of the present invention comprises forming a floating gate prior to the high impurity concentration regions, and forming the high impurity concentration regions just outside the channel region by self-alignment with the floating gate using the floating gate as part of a mask.

The features and advantages of the present invention are mentioned below in further detail by way of some examples in conjunction with the accompanying drawing. However, it should be noted that the examples are only to illustrate the invention, and it is possible to effect various other modifications and improvements without departing from the scope of the present invention.

DESCRIPTION OF THE PREFERRED EMBODIMENTS

Embodiment 1

Figure 1:
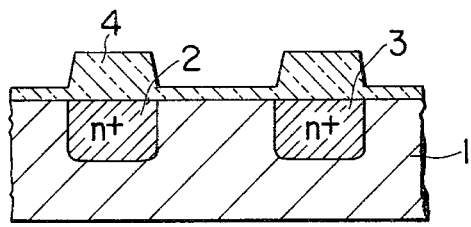
FIG. 1 to FIG. 3 are cross-sectional views showing steps for producing a nonvolatile semiconductor memory according to the present invention.
Figure 2:
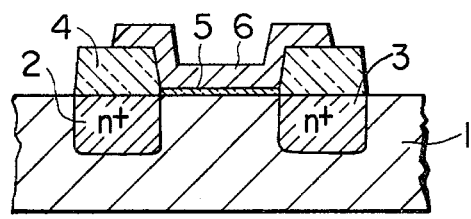

A film of silicon dioxide is formed on the surface of a p-type silicon substrate 1 by way of a conventional thermal oxidation method. Openings are formed by means of a conventional photo-lithographic method in the film of silicon dioxide in places where a source and a drain are to be formed. Impurities of the n-type are thermally diffused into the p-type silicon substrate through the openings thereby to form a source region 2 and a drain region 3. After the film of silicon dioxide is removed, the surface of the resulting silicon substrate is oxidized by a low-temperature wet oxidation method at 800° C. for 210 minutes. In this case, as shown in FIG. 1, a thick oxide film 4 having a thickness of 550 nm is formed on the source and drain regions 2 and 3 containing impurities at high concentrations, and a thin oxide film having a thickness of 250 nm is formed on other regions containing impurities at low concentrations. Part of the thus formed oxide film is then removed using an etching solution (HF:H$_2$O=1:10) in such a manner that the thin oxide film is completely removed and the surface of the silicon substrate 1 appears. The oxide film of a thickness of about 300 nm therefore remains on the source and drain regions 2 and 3. The exposed surface of the silicon substrate 1 is once oxidized in an atmosphere consisting of oxygen diluted with nitrogen under a pressure of $10^{-2}$ to $10^{-3}$ atm. in a furnace heated at such a high temperature as 900° C. or higher, and a polycrystalline silicon layer of a thickness of 200 to 500 nm is formed on the surface of the silicon substrate. This polycrystalline silicon layer is doped with impurity by an ion implantation method. For this purpose, B+ ions are accelerated at a voltage of 30 KV and implanted at a dose density of $5 \times 10^{13}$ ions/cm$^2$, or P+ ions are accelerated at a voltage of 30 KV and at a dose density of $2 \times 10^{14}$ ions/cm$^2$. The thus obtained oxide film and the polycrystalline silicon layer are formed to a desired shape as shown in FIG. 2 by means of the photo-lithographic method. The oxide film serves as a gate insulating film 5 and the polycrystalline silicon layer serves as a floating gate 6. The floating gate is extending in a direction connecting the source region to the drain region and has the same width as that of the channel region, and its both ends are riding on the oxide film 4 on the source and drain regions 2 and 3. When the control gate is to be provided thereon via another insulating film, the riding portions act such that a voltage applied to the control gate is effectively divided between the floating gate and substrate owing to the capacitance deviation, such that the electric charge is easily injected into the floating gate. In order to increase the writing, erasing and reading speeds, the gate oxide film 5 should preferably have a thickness of smaller than 20 nm and more preferably a thickness within a range of smaller than 10 nm to about 4 nm. With the thickness being smaller than about 3 nm, however, the stored electric charges escape from the floating gate due to the direct tunnel effect, whereby it becomes difficult to retain the written information. As for the elements which do not require an electrical writing-erasing function, the upper limit of the film thickness may be set to be nearly the same as the film thickness of an ordinary gate oxide film.

Figure 3:
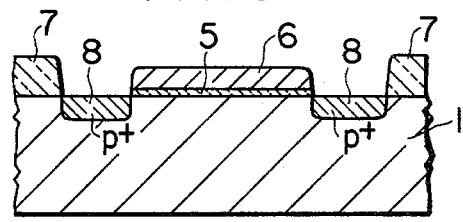

Then, a mask 7 for forming the high impurity concentration regions is formed as shown in FIG. 3. The mask 7 may be a silicon oxide film or a photoresist film. FIG. 3 is a cross-sectional view of the device cut in a vertical direction with respect to a line connecting the source region to the drain region passing through the channel region. High impurity concentration regions 8 are formed by implanting B+ ions accelerated at a voltage of 30 kV at a dose density of $7 \times 10^{12}$ to $2 \times 10^{14}$ ions/cm$^2$; regions having a reverse breakdown voltage of 6 to 15 volts at source and/or drain are thus formed. In this case, the floating gate 6 constitutes a part of the mask. Namely, the high impurity concentration regions 8 are formed just outside the channel region by self-alignment with the floating gate 6 which serves as a portion of the mask. The openings formed in the mask 7 may overhang on the source region 2 or the drain region 3. The source region 2 and the drain region 3 have been covered with a thick oxide film 4. Therefore, B+ ions are not allowed to reach the source region 2 or the drain region 3. Even if small amounts of ions may reach there, the electrical properties of the source region 2 and the drain region 3 remain unchanged because of their very high impurity concentration.

Referring to FIG. 3, the high impurity concentration regions 8 have been provided on both sides of the channel region. The high impurity concentration regions 8, however, need not necessarily be provided on both sides, but may be provided on one side only.

Figure 4:
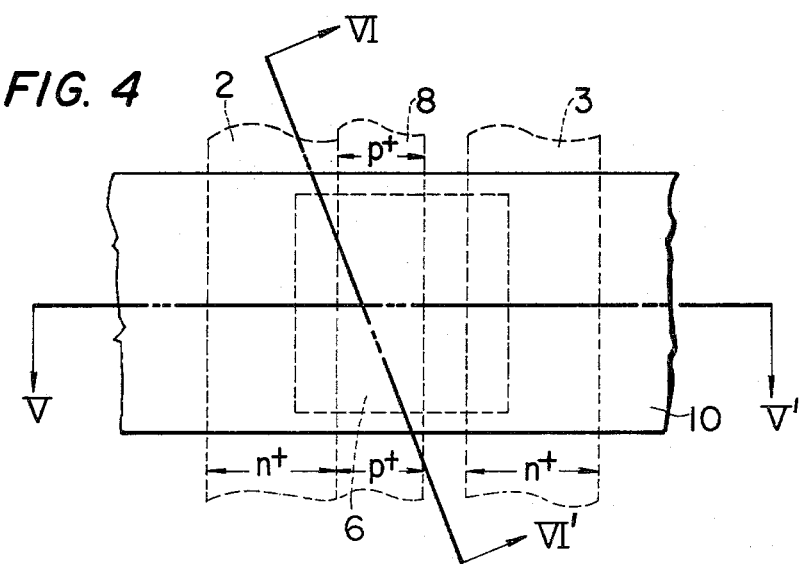
FIG. 4 is a plan view of the device obtained through the steps of FIGS. 1 to 3.
Figure 5:
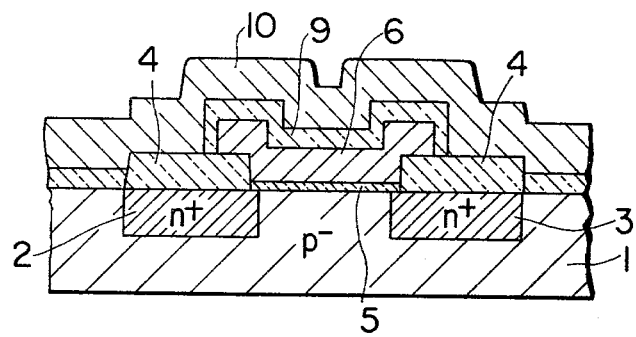
FIG. 5 and FIG. 6 are cross-sectional views along lines V-V' and VI-VI' of FIG. 4.
Figure 6:
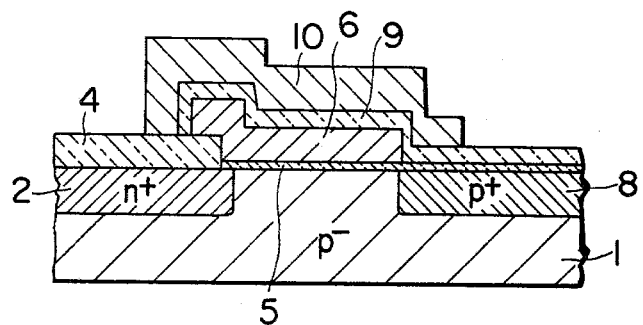
Figure 7:
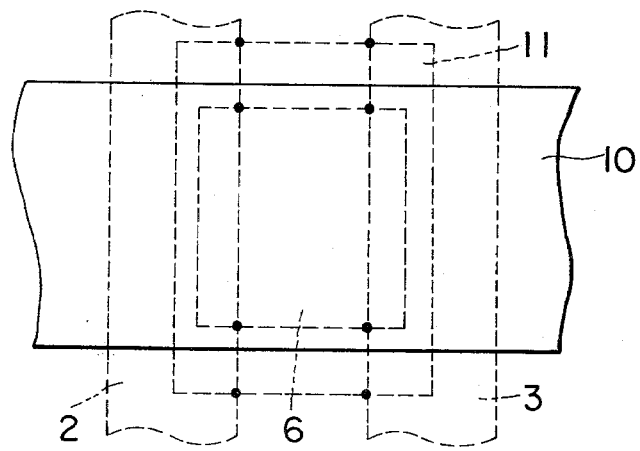
FIG. 7 and FIG. 8 are plan views of devices according to other embodiments of the present invention.
Figure 8:
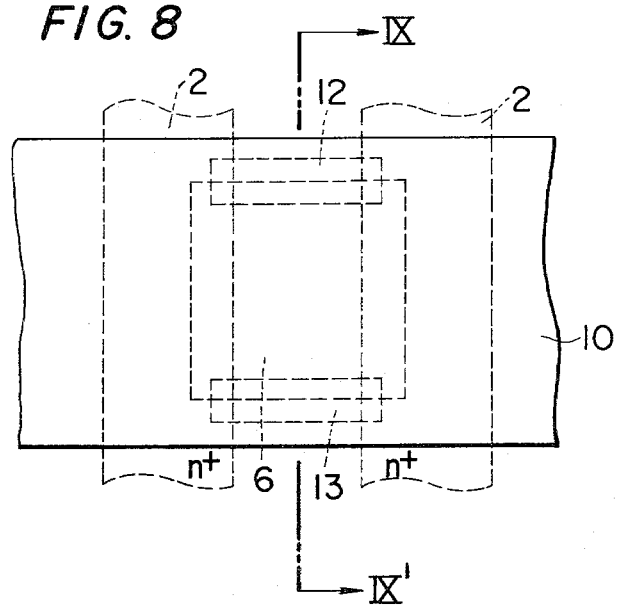
Figure 9:
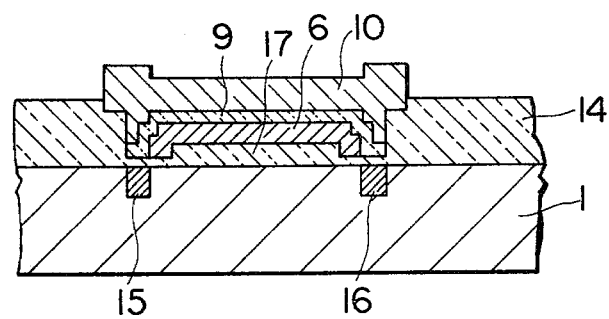
FIG. 9 is a cross-sectional view along a line IX-IX' of FIG. 8.
Figure 10:
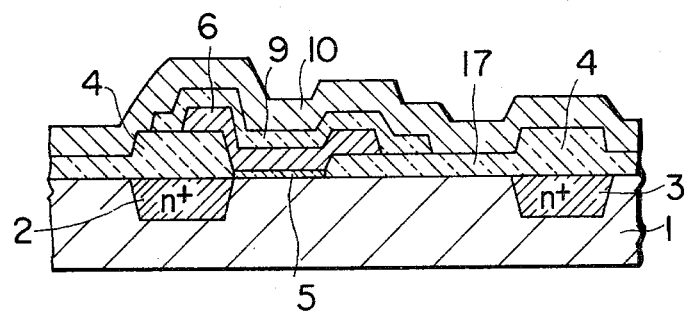
FIG. 10 is cross-sectional view of a device according to a further embodiment of the present invention.

After the mask 7 has been removed, the surface of the floating gate 6 is thermally oxidized to form a second insulating film 9. At this moment, the surface of the substrate is also oxidized. A film of silicon nitride may also be coated thereon. On the second insulating film 9 is further formed a control gate 10 as shown in a plan view of FIG. 4. FIG. 5 is a cross-sectional view along a line V-V' of FIG. 4, and FIG. 6 is a cross-sectional view along a line VI-VI'.

As will be obvious from the above-mentioned embodiment, according to the present invention, the high impurity concentration layer is formed after the floating gate, and the subsequent steps are all carried out at low temperatures of 900° C. or lower. Therefore, the layer of high impurity concentrations is not excessively diffused, and the concentrations of impurities can be well controlled, thereby overcoming these difficulties encountered in the prior art. Since the high impurity concentration regions have been formed outside the channel region but in contact therewith, neither the width of the channel region nor the threshold voltage need be increased, unlike the prior art. Besides, since the floating gate is so formed as to ride on the source and drain chip will not be contaminated by the photoresist agent. The insulating film may be retained even after ions have been implanted, so that it is used as a second gate insulating film between the control gate and the floating gate.

What is claimed is:

1. Method for producing a nonvolatile semiconductor memory comprising;
   a step of forming a source region and a drain region in a surface portion of a semiconductor substrate having a first conductivity type, said source region and said drain region having a second conductivity type which is opposite to said first conductivity type;
   a step of forming a thin insulating film on a channel region between said source region and said drain region;
   a step of depositing a silicon layer on at least a portion of said thin insulating film;
   a step of doping said silicon layer and at the same time at least one surface portion of said substrate, which is adjacent to said channel region, with impurity having the same conductivity type as that of said substrate for forming a floating gate and at least one high impurity concentration region, doping of said at least one high impurity concentration region being effected by self-alignment with said floating gate using said floating gate as part of a mask;
   a step of forming a second insulating film on the surface of said floating gate; and
   a step of forming a control gate electrode on said second insulating film.

2. A method for producing a nonvolatile semiconductor memory according to claim 1, wherein the high impurity concentration regions are formed by self-alignment with the floating gate as well as with either one of the source region and the drain region.

3. A method for producing a nonvolatile semiconductor memory according to claim 1, wherein the high impurity concentration regions are formed by self-alignment with the floating gate as well as with both the source region and the drain region.

4. A method for producing a nonvolatile semiconductor memory according to claim 1, wherein a thin insulating film is formed on the channel region and on at least a portion of the area along the sides that cross the source region and the drain region, a thick insulating film is formed on other regions, the floating gate is so formed as to cover a portion of the thin insulating film as well as to cover all of the thick insulating film, and the high impurity concentration regions are formed through the thin insulating film which has not been covered by the floating gate.

5. A method for producing a nonvolatile semiconductor memory according to claim 1, wherein a thick film for insulating the gate and a thin film for insulating the gate are formed closely to each other on the channel region, an ordinary MOS-type semiconductor is formed on the thick film for insulating the gate, and a nonvolatile memory is formed on the thin film for insulating the gate.

6. A method for producing a nonvolatile semiconductor memory according to claim 1, wherein said at least one high impurity concentration region lies over the source and drain regions, and extends between said source and drain regions.

7. A method for producing a nonvolatile semiconductor memory according to claim 6, wherein said at least one high impurity concentration region extends the entire length between said source and drain regions.

8. A method for producing a nonvolatile semiconductor memory according to claim 1, wherein the floating gate is formed to ride on at least one of said source and drain regions.

9. A method for producing a nonvolatile semiconductor memory according to claim 8, wherein the floating gate is formed to ride on both of said source and drain regions.

10. A method for producing a nonvolatile semiconductor memory according to claim 8, wherein the floating gate is formed to ride on one of said source and drain regions.

11. A method for producing a nonvolatile semiconductor memory according to claim 10, wherein a gate insulating film is formed adjacent the other of the source or drain regions on which the floating gate does not ride, and said floating gate is formed to ride on said gate insulating film.

* * * * *